US012805095B2

(12) United States Patent
Lin et al.

(10) Patent No.: US 12,805,095 B2
(45) Date of Patent: Nov. 17, 2026

(54) LIGHT-EMITTING DIODE DISPLAY PANEL

(71) Applicant: Lextar Electronics Corporation, Hsinchu (TW)

(72) Inventors: Chih-Hao Lin, Hsinchu (TW); Wei-Yuan Ma, Hsinchu (TW); Jo-Hsiang Chen, Hsinchu (TW)

(73) Assignee: ENNOSTAR CORPORATION, Hsinchu City (TW)

( * ) Notice: Subject to any disclaimer, the term of this patent is extended or adjusted under 35 U.S.C. 154(b) by 910 days.

(21) Appl. No.: 17/821,210

(22) Filed: Aug. 22, 2022

(65) Prior Publication Data

US 2023/0178523 A1 Jun. 8, 2023

(30) Foreign Application Priority Data

Dec. 6, 2021 (TW) ................................ 110145405

(51) Int. Cl.
*H10H 29/14* (2025.01)
*H10H 29/24* (2026.01)
(Continued)

(52) U.S. Cl.
CPC .......... *H10H 29/142* (2025.01); *H10H 29/24* (2025.01); *H10H 29/32* (2025.01);
(Continued)

(58) Field of Classification Search
CPC ..... H10H 29/10–142; H10H 29/20–24; H10H 29/30–49; H10H 29/32; H10H 29/34; H10H 29/352
See application file for complete search history.

(56) References Cited

U.S. PATENT DOCUMENTS 8,896,505 B2 11/2014 Cok et al.
10,818,644 B2 10/2020 Chang et al.
2021/0328111 A1* 10/2021 Chang ................ H01L 25/0753

FOREIGN PATENT DOCUMENTS

TW 201101480 A 1/2011
WO 2021/156902 A1 8/2021

OTHER PUBLICATIONS

Chinese language office action dated 2022-08-26, issued in application No. TW 110145405.

* cited by examiner

*Primary Examiner* — Scott B Geyer
(74) *Attorney, Agent, or Firm* — McClure, Qualey & Rodack, LLP

(57) ABSTRACT

A light-emitting diode display panel includes a driving substrate, and a first light-emitting region and a second light-emitting region disposed on the driving substrate. The first light-emitting region has a first region and a second region adjacent to the first region in the first direction. The second light-emitting region is adjacent to the first light-emitting region and has a first corresponding region. The second region is between the first region and the first corresponding region. The light-emitting diode display panel further includes pixels disposed in the first region, the second region, and the first corresponding region. Each pixel includes a first light-emitting unit. The first pitch is between the first light-emitting units in the first region and in the second region. The second pitch is between the first light-emitting units in the second region and the first corresponding region. The first pitch is shorter than the second pitch.

16 Claims, 7 Drawing Sheets

(51) Int. Cl.
*H10H 29/30* (2025.01)
*H10H 29/32* (2025.01)
*H10H 29/34* (2025.01)
*H10W 90/00* (2026.01)

(52) U.S. Cl.
CPC .......... *H10H 29/34* (2025.01); *H10H 29/352* (2025.01); *H10W 90/00* (2026.01)

LIGHT-EMITTING DIODE DISPLAY PANEL

CROSS REFERENCE TO RELATED APPLICATIONS

This Application claims priority of Taiwan Patent Application No. 110145405, filed on Dec. 6, 2021, the entirety of which is incorporated by reference herein.

BACKGROUND

Technical Field

Embodiments of the present disclosure relate in general to a light-emitting diode display panel, and in particular they relate to a light-emitting diode display panel that includes light-emitting units with non-fixed pitches.

Description of the Related Art

In order to improve the display performance of light-emitting diode (LED) display screens, an LED display screen has been developed to have a small pitch. For example, the pixel density of the LED display screen may be increased by reducing the distance between the LEDs. The LED display screen may be formed through, for example, chip-on-board (COB) technology or package-on-board (POB) technology. Among them, COB technology is mainly to stick multiple red, green, and blue light-emitting diode chips on a circuit board or a substrate; POB technology is mainly to integrate a pixel structure or multiple pixel structures composed of multiple light-emitting diode chips in a package, and then install these packages on a circuit board or a substrate. In addition, if multiple pixel structures are assembled in one package, then this may be called an N-in-one package.

Traditional POB technology uses a die-bonder or a high-precision surface mount technology (SMT) equipment to produce multiple light-emitting diode chips in the package. However, using the die-bonder or SMT equipment to perform die-transfer and die-bonding to produce a small-pitch N-in-one package has the problems of increased manufacturing costs and a complex production process. Moreover, the use of a general die-bonder to perform a die-transfer process will further increase costs due to the lower productivity per unit time, and the larger package substrate area that is required leads to a higher package substrate cost.

SUMMARY

The embodiments of the present disclosure provide a light-emitting diode display panel that includes light-emitting units with non-fixed pitches. In the light-emitting diode display panel according to some embodiments of the present disclosure, the pitch between a light-emitting unit that emits light of a specific color and an adjacent light-emitting unit that emits light of the same color in the same light-emitting region (e.g., the same light-emitting diode package) is shorter than the pitch between it and an adjacent light-emitting unit that emits light of the same color in an adjacent light-emitting region.

Some embodiments of the present disclosure include a light-emitting diode display panel. The light-emitting diode display panel includes a driving substrate, a first light-emitting region, and a second light-emitting region. The first light-emitting region is disposed on the driving substrate and having a first region and a second region, wherein the second region is adjacent to the first region in a first direction. The second light-emitting region is disposed on the driving substrate and adjacent to the first light-emitting region in the first direction, wherein the second light-emitting region has a first corresponding region, and the second region is between the first region and the first corresponding region. The light-emitting diode display panel further includes a plurality of pixels disposed in the first region, the second region, and the first corresponding region. Each pixel includes a first light-emitting unit, a second light-emitting unit, and a third light-emitting unit. A first pitch is between the first light-emitting unit in the first region and the first light-emitting unit in the second region, a second pitch is between the first light-emitting unit in the second region and the first light-emitting unit in the first corresponding region, and the first pitch is shorter than the second pitch.

Some embodiments of the present disclosure include a light-emitting diode display panel. The light-emitting diode display panel includes a driving substrate and a plurality of light-emitting regions disposed on the driving substrate and forming an array. Each light-emitting region has a first region and a second region adjacent to the first region in a first direction. The light-emitting diode display panel also includes a plurality of pixels disposed in the first region and the second region. Each pixel includes a first light-emitting unit, a second light-emitting unit, and a third light-emitting unit. In one of the light-emitting regions, a first pitch is between the first light-emitting unit in the first region and the first light-emitting unit in the second region, a second pitch is between the first light-emitting unit in the second region and the first light-emitting unit in another adjacent light-emitting region, and the first pitch is shorter than the second pitch.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
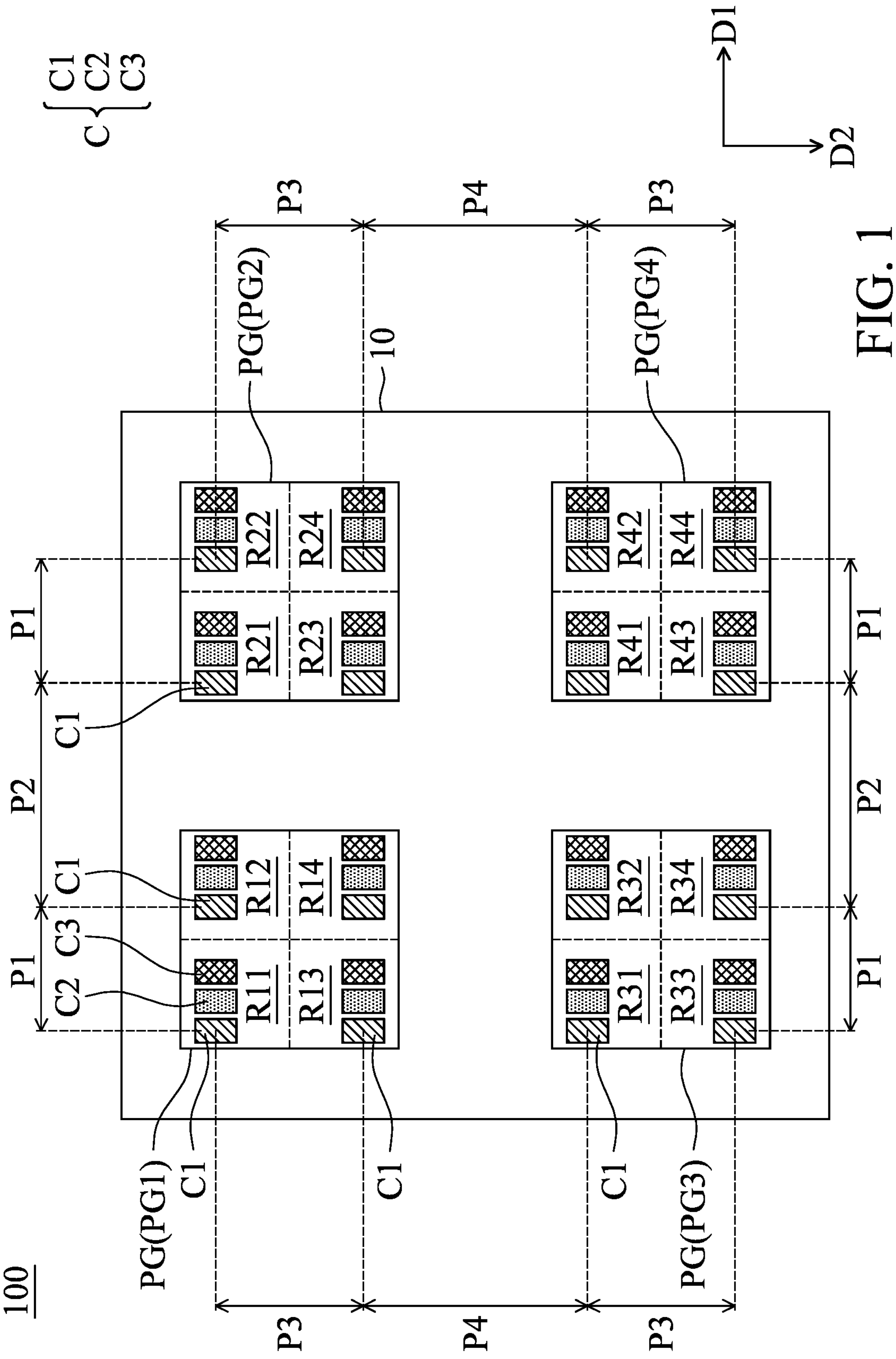
FIG. 1 is a partial top view illustrating the light-emitting diode display panel according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Figure 2:
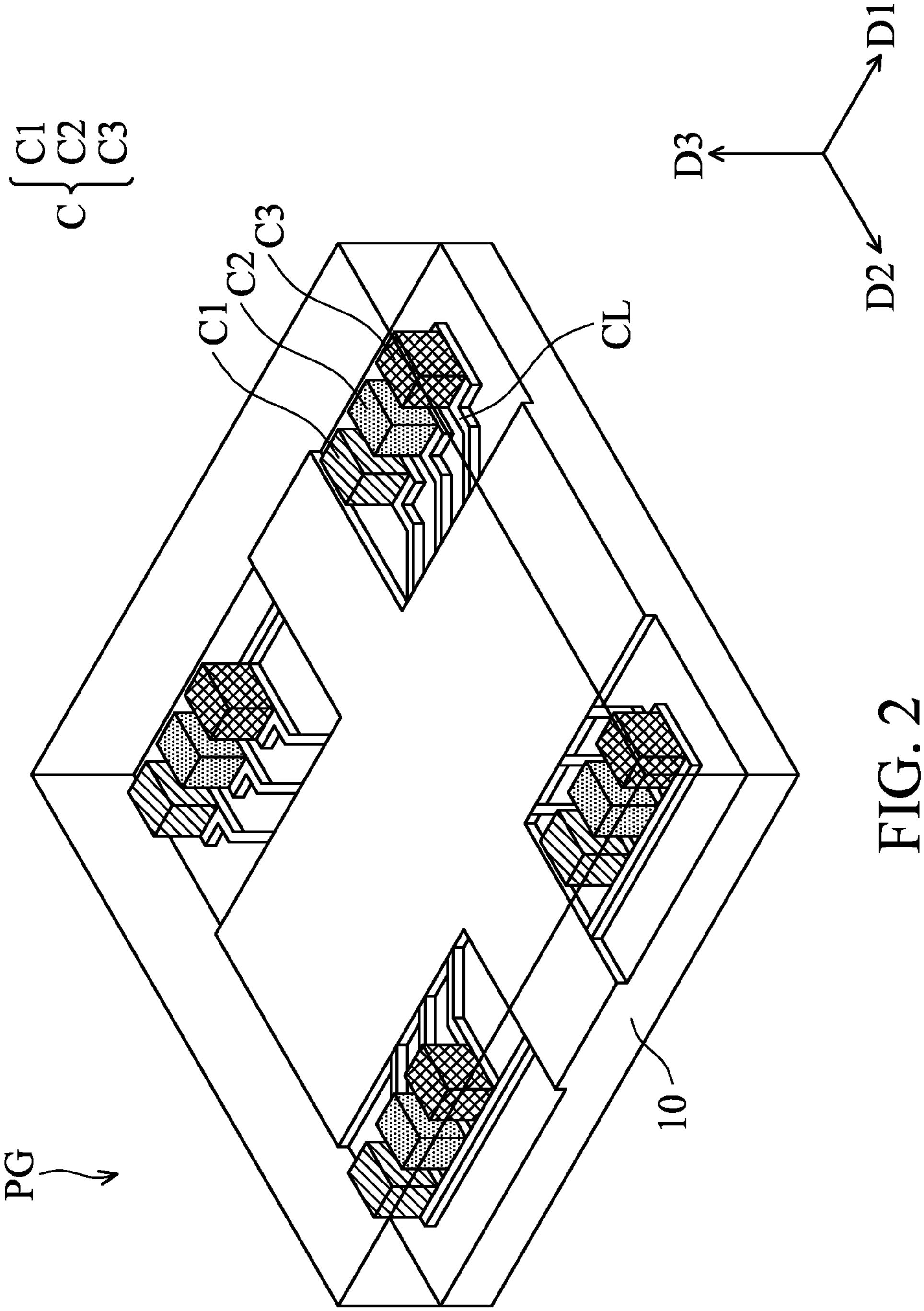
FIG. 2 is a three-dimensional view of the light-emitting region taking a light-emitting diode package with multiple pixels as an embodiment according to the present disclosure.

FIG. 1 is a partial top view illustrating the light-emitting diode display panel 100 according to an embodiment of the present disclosure. The light-emitting diode display panel 100 includes multiple light-emitting regions PG, wherein each light-emitting region PG has multiple (e.g., four) regions, and the pixel C is disposed in each region. The pixel C may, for example, emit red light, green light, and blue light through multiple light-emitting units as an RGB pixel, which will be described in detail later. FIG. 2 is a three-dimensional view of the light-emitting region PG taking a light-emitting diode package with multiple pixels as an embodiment according to the present disclosure. It should be noted that some components of the light-emitting diode display panel 100 and/or the light-emitting region PG have been omitted in FIG. 1 and FIG. 2 for sake of brevity.

Referring to FIG. 1, in some embodiments, the light-emitting diode display panel 100 includes a driving substrate 10. The driving substrate 10 may be, for example, a rigid circuit substrate, which may include elemental semiconductors (e.g., silicon or germanium), compound semiconductors (e.g., silicon carbide (SiC), gallium arsenide (GaAs), indium arsenide (InAs) or indium phosphide (InP)), alloy semiconductors (e.g., SiGe, SiGeC, GaAsP or GaInP), any other suitable semiconductor, or a combination thereof. The driving substrate 10 may also be a flexible circuit substrate, a semiconductor-on-insulator (SOI) substrate, or a glass substrate.

Moreover, the driving substrate 10 may include various conductive parts (e.g., conductive lines or vias). For example, the aforementioned conductive parts may include aluminum (Al), copper (Cu), tungsten (W), their respective alloys, any other suitable conductive material, or a combination thereof.

In some embodiments, the light-emitting diode display panel 100 includes multiple light-emitting regions PG disposed on the driving substrate 10 and electrically connected to the driving substrate 10. In particular, as shown in FIG. 1, the light-emitting diode display panel 100 includes a light-emitting region PG1, a light-emitting region PG2, a light-emitting region PG3, and a light-emitting region PG4. The light-emitting region PG1, the light-emitting region PG2, the light-emitting region PG3, and the light-emitting region PG4 may have the same or similar structure.

Moreover, each light-emitting region PG1, PG2, PG3, and PG4 may have (or be divided into) multiple regions. As shown in FIG. 1, in some embodiments, the light-emitting region PG1 has a first region R11 and a second region R12 adjacent to the first region R11 in the first direction D1, and the light-emitting region PG2 has a first region R21. The first region R21 of the light-emitting region PG2 corresponds to the first region R11 of the light-emitting region PG1, and the second region R12 of the light-emitting region PG1 is between the first region R11 of the light-emitting region PG1 and the first region R21 of the light-emitting region PG2.

The light-emitting region PG1 may have more than two regions. As shown in FIG. 1, the light-emitting region PG1 further has a third region R13 and a fourth region R14, which constitute a total of first to fourth regions R11-R14. In some embodiments, the light-emitting region PG2 has first to fourth regions R21-R24, the light-emitting region PG3 has first to fourth regions R31-R34, and the light-emitting region PG4 has first to fourth regions R41-R44. Besides, the relative positions of the first to fourth regions R21-R24, the relative positions of the first to fourth regions R31-R34, and the relative positions of the first to fourth regions R41-R44 may be the same as or similar to the relative positions of the first to fourth regions R11-R14.

Referring to FIG. 1, in some embodiments, the light-emitting diode display panel 100 includes multiple pixels C disposed in each region of the light-emitting region PG. For example, the pixel C is disposed in the first to fourth regions R11 to R14 of the emitting region PG1, the first to fourth regions R21 to R24 of the emitting region PG2, the first to fourth regions R31 to R34 of the emitting region PG3, and the first to fourth regions R41 to R44 of the emitting region PG4. In some embodiments, each pixel C includes a first light-emitting unit C1, a second light-emitting unit C2, and a third light-emitting unit C3, wherein the first light-emitting unit C1, the second light-emitting unit C2, and the third light-emitting unit C3 may respectively emit red light, green light, and blue light. In some embodiments, the first light-emitting unit C1, the second light-emitting unit C2, and the third light-emitting unit C3 includes light-emitting diode chips, of which small-sized micro light-emitting diode chip (micro LED chips) may be used.

The light-emitting region PG in FIG. 2 may be a light-emitting diode package with multiple pixels, which may be correspondingly used in the structure of the light-emitting region PG1, light-emitting region PG2, light-emitting region PG3, and light-emitting region PG4 in FIG. 1. Referring to FIG. 1 and FIG. 2, in some embodiments, the light-emitting diode package is a 4-in-1 LED package that includes four pixels C, wherein each pixel C includes a first light-emitting unit C1, a second light-emitting unit C2, and a third light-emitting unit C3 (which may respectively emit red light, green light, and blue light). In some embodiments, the first light-emitting unit C1, the second light-emitting unit C2, and the third light-emitting unit C3 includes light-emitting diode chips, of which small-sized micro light-emitting diode chip (micro LED chips) may be used.

In some other embodiments, each light-emitting region PG has more regions. For example, if each light-emitting region PG has sixteen regions, then the light-emitting diode package may be a 16-in-1 LED package that includes sixteen pixels C, wherein each pixel C includes a first light-emitting unit C1, a second light-emitting unit C2, and a third light-emitting unit C3 (which may respectively emit red light, green light, and blue light).

The light-emitting diode chip may include an N-type semiconductor layer, a light-emitting layer, and a P-type semiconductor layer, and the light-emitting layer is disposed between the N-type semiconductor layer and the P-type semiconductor layer, but the present disclosure is not limited thereto. The light emitted by the micro light-emitting diode chip is determined by the light-emitting layer.

The N-type semiconductor layer may include a group II-VI material (e.g., zinc selenide (ZnSe)) or a group III-V material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the N-type semiconductor layer may include dopants such as silicon (Si) or germanium (Ge), but the present disclosure is not limited thereto.

The light-emitting layer includes at least one undoped semiconductor layer or at least one low-doped semiconductor layer. For example, the light-emitting layer may be a quantum well (QW) layer, which may include indium gallium nitride ($In_xGa_{1-x}N$) or gallium nitride (GaN), but the present disclosure is not limited thereto. Alternately, the light-emitting layer may be a multiple quantum well (MQW) layer.

The P-type semiconductor layer may include a group II-VI material (e.g., zinc selenide (ZnSe)) or a group III-V material (e.g., gallium nitride (GaN), aluminum nitride (AlN), indium nitride (InN), indium gallium nitride (InGaN), aluminum gallium nitride (AlGaN) or aluminum indium gallium nitride (AlInGaN)), and the P-type semiconductor layer may include dopants such as magnesium (Mg) or carbon (C), but the present disclosure is not limited thereto. Moreover, the N-type semiconductor layer may be a single-layer or multi-layer structure, and the P-type semiconductor layer may be a single-layer or multi-layer structure.

Moreover, in some embodiments, the first light-emitting unit C1, the second light-emitting unit C2, and the third light-emitting unit C3 emit different color lights, and the different color lights include red light, green light, and blue light. For example, The first light emitting unit C1 may emit blue light, which includes a blue light-emitting diode (e.g., a blue micro LED); the second light-emitting unit C2 may emit green light, which includes a green light-emitting diode (e.g., a green micro LED), or includes a blue light-emitting diode and green phosphor or green quantum dots (QD); the third light-emitting unit C3 may emit red light, which includes a red light-emitting diode (e.g., a red micro LED), or includes a blue light-emitting diode and red phosphor or red quantum dots, but the present disclosure is not limited thereto.

In some other embodiments, the first light-emitting unit C1, the second light-emitting unit C2, and the third light-emitting unit C3 may also emit ultraviolet light, cyan light, magenta light, yellow light, any other color light, or a combination thereof. Moreover, in some other embodiments, the pixel C includes more than three light-emitting units. For example, in addition to the aforementioned first to third light-emitting units C1 to C3, the pixel C may further include a fourth light-emitting unit (not shown in the drawings). The fourth light-emitting unit emits yellow light or light of another required color, and the fourth light-emitting unit is adjacent to the third light-emitting unit C3 in the first direction D1.

As shown in FIG. 1 and FIG. 2, in some embodiments, the second light-emitting unit C2 is between the first light-emitting unit C1 and the third light-emitting unit C3, and the first light-emitting unit Cl, the second light-emitting unit C2, and the third light-emitting unit C3 are arranged in the first direction D1. As shown in FIG. 2, the first light-emitting unit C1, the second light-emitting unit C2, and the third light-emitting unit C3 may be electrically connected to the driving substrate 10 through the conductive line CL.

Referring to FIG. 1, in some embodiments, in the first direction D1, the first pitch P1 is between the first light-emitting unit C1 in the first region R11 of the light-emitting region PG1 and the first light-emitting unit C1 in the second region R12 of the light-emitting region PG1, the second pitch P2 is between the first light-emitting unit C1 in the second region R12 of the light-emitting region PG1 and the first light-emitting unit C1 in the first region R21 of the light-emitting region PG2, and the first pitch P1 is shorter than the second pitch P2 (i.e., P1<P2).

In other words, the distance between the first light-emitting unit C1 in the first region R11 of the light-emitting region PG1 and the first light-emitting unit C1 in the second region R12 of the light-emitting region PG1 in the first direction D1 is the first pitch P1, the distance between the first light-emitting unit C1 in the second region R12 of the light-emitting region PG1 and the first light-emitting unit C1 in the first region R21 of the light-emitting region PG2 (i.e., the adjacent light-emitting region) in the first direction D1 is the second pitch P2, and the first pitch P1 is shorter than the second pitch P2 (i.e., P1<P2).

In some embodiments, the first pitch P1 is greater than about 0.6 mm and less than about 1.0 mm. Moreover, in some embodiments, the ratio of the first pitch P1 to the second pitch P2 is between 0.3 and 0.9. In this embodiments, in the same region (e.g., the first region R11 of the light-emitting region PG1), the distance between the first light-emitting unit C1 and the second light-emitting unit C2 is equal to the distance between the second light-emitting unit C2 and the third light-emitting unit C3. Therefore, the first pitch P1 may also indicate the distance between the second light-emitting unit C2 in the first region R11 of the light-emitting region PG1 and the second light-emitting unit C2 in the second region R12 of the light-emitting region PG1 in the first direction D1, or the distance between the third light-emitting unit C3 in the first region R11 of the light-emitting region PG1 and the third light-emitting unit C3 in the second region R12 of the light-emitting region PG1 in the first direction D1; the second pitch P2 may also indicate the distance between the second light-emitting unit C2 in the second region R12 of the light-emitting region PG1 and the second light-emitting unit C2 in the first region R21 of the light-emitting region PG2 (i.e., the adjacent light-emitting region) in the first direction D1, or the distance between the third light-emitting unit C3 in the second region R12 of the light-emitting region PG1 and the third light-emitting unit C3 in the first region R21 of the light-emitting region PG2 (i.e., the adjacent light-emitting region) in the first direction D1.

As shown in FIG. 1, in some embodiments, the light-emitting region PG1 also has a third region R13, the third region R13 is adjacent to the first region R11 in a second direction D2 that is perpendicular to the first direction D1, and a third direction D3 in FIG. 2 is perpendicular to the first direction D1 and the second direction D2. As shown in FIG. 1, in some embodiments, the light-emitting region PG3 is adjacent to the light-emitting region PG1 in the second direction D2, and the light-emitting region PG3 has a first region R31. The first region R31 of the light-emitting region PG3 corresponds to the first region R11 of the light-emitting region PG1, and the third region R13 of the light-emitting region PG1 is between the first region R11 of the light-emitting region PG1 and the first region R31 of the light-emitting region PG3

Similarly, the pixel C is also disposed in the third region R13 of the emitting region PG1 and the first region R31 of the emitting region PG3. Moreover, as shown in FIG. 1, in some embodiments, in the second direction D2, the third pitch P3 is between the first light-emitting unit C1 in the first region R11 of the light-emitting region PG1 and the first light-emitting unit C1 in the third region R13 of the light-emitting region PG1, the fourth pitch P4 is between the first light-emitting unit C1 in the third region R13 of the light-emitting region PG1 and the first light-emitting unit C1 in the first region R31 of the light-emitting region PG3 (i.e., the adjacent light-emitting region), and the third pitch P3 is shorter than the fourth pitch P4 (i.e., P3<P4).

In other words, the distance between the first light-emitting unit C1 in the first region R11 of the light-emitting region PG1 and the first light-emitting unit C1 in the third region R13 of the light-emitting region PG1 in the second direction D2 is the third pitch P3, the distance between the first light-emitting unit C1 in the third region R13 of the light-emitting region PG1 and the first light-emitting unit C1 in the first region R31 of the light-emitting region PG3 (i.e., the adjacent light-emitting region) in the second direction D2 is the fourth pitch P4, and the third pitch P3 is shorter than the fourth pitch P4 (i.e., P3<P4).

In some embodiments, the third pitch P3 is greater than about 0.6 mm and less than about 1.0 mm. Moreover, in some embodiments, the ratio of the third pitch P3 to the fourth pitch P4 is between 0.3 and 0.9. In this embodiments, the third pitch P3 is equal to the first pitch P1 (i.e., P3=P1), and the fourth pitch P4 is equal to the second pitch P2 (i.e., P4=P2). Similarly, the third pitch P3 may also indicate the distance between the second light-emitting unit C2 in the first region R11 of the light-emitting region PG1 and the second light-emitting unit C2 in the third region R13 of the light-emitting region PG1 in the second direction D2, or the distance between the third light-emitting unit C3 in the first region R11 of the light-emitting region PG1 and the third light-emitting unit C3 in the third region R13 of the light-emitting region PG1 in the second direction D2; the fourth pitch P4 may also indicate the distance between the second light-emitting unit C2 in the third region R13 of the light-emitting region PG1 and the second light-emitting unit C2 in the first region R31 of the light-emitting region PG3 (i.e., the adjacent light-emitting region) in the second direction D2, or the distance between the third light-emitting unit C3 in the third region R13 of the light-emitting region PG1 and the third light-emitting unit C3 in the first region R31 of the light-emitting region PG3 (i.e., the adjacent light-emitting region) in the second direction D2.

As shown in FIG. 1, in some embodiments, the light-emitting region PG1 also has a fourth region R14. The fourth region R14 is adjacent to the third region R13 in the first direction D1 and adjacent to the second region R12 in the second direction D2. Similarly, as shown in FIG. 1, in some embodiments, in the first direction D1, the first pitch P1 is between the first light-emitting unit C1 in the third region R13 of the light-emitting region PG1 and the first light-emitting unit C1 in the fourth region R14 of the light-emitting region PG1, the second pitch P2 is between the first light-emitting unit C1 in the fourth region R14 of the light-emitting region PG1 and the first light-emitting unit C1 in the third region R23 of the light-emitting region PG2 (i.e., the adjacent light-emitting region), and the first pitch P1 is shorter than the second pitch P2 (i.e., P1<P2).

In other words, the distance between the first light-emitting unit C1 in the third region R13 of the light-emitting region PG1 and the first light-emitting unit C1 in the fourth region R14 of the light-emitting region PG1 in the first direction D1 is the first pitch P1, the distance between the first light-emitting unit C1 in the fourth region R14 of the light-emitting region PG1 and the first light-emitting unit C1 in the third region R23 of the light-emitting region PG2 (i.e., the adjacent light-emitting region) in the first direction D1 is the second pitch P2, and the first pitch P1 is shorter than the second pitch P2 (i.e., P1<P2).

Moreover, as shown in FIG. 1, in some embodiments, in the second direction D2, the third pitch P3 is between the first light-emitting unit C1 in the second region R12 of the light-emitting region PG1 and the first light-emitting unit C1 in the fourth region R14 of the light-emitting region PG1, the fourth pitch P4 is between the first light-emitting unit C1 in the fourth region R14 of the light-emitting region PG1 and the first light-emitting unit C1 in the second region R32 of the light-emitting region PG3 (i.e., the adjacent light-emitting region), and the third pitch P3 is shorter than the fourth pitch P4 (i.e., P3<P4).

In other words, the distance between the first light-emitting unit C1 in the second region R12 of the light-emitting region PG1 and the first light-emitting unit C1 in the fourth region R14 of the light-emitting region PG1 in the second direction D2 is the third pitch P3, the distance between the first light-emitting unit C1 in the fourth region R14 of the light-emitting region PG1 and the first light-emitting unit C1 in the second region R32 of the light-emitting region PG3 (i.e., the adjacent light-emitting region) in the second direction D2 is the fourth pitch P4, and the third pitch P3 is shorter than the fourth pitch P4 (i.e., P3<P4).

Referring to FIG. 1, the light-emitting region PG2 has first to fourth regions R21-R24. In some embodiments, the relative positions of the first to fourth regions R21-R24 are the same as or similar to the relative positions of the first to fourth regions R11-R14. In other words, the second region R22 is adjacent to the first region R21 in the first direction D1, the third region R23 is adjacent to the first region R21 in the second direction D2, and the fourth region R24 is adjacent to the third region R23 in the first direction D1 and adjacent to the second region R22 in the second direction D2.

As shown in FIG. 1, in some embodiments, in the first direction D1, the first pitch P1 is between the first light-emitting unit C1 in the first region R21 of the light-emitting region PG2 and the first light-emitting unit C1 in the second region R22 of the light-emitting region PG2, the second pitch P2 is between the first light-emitting unit C1 in the first region R21 of the light-emitting region PG2 and the first light-emitting unit C1 in the second region R12 of the light-emitting region PG1 (i.e., the adjacent light-emitting region), and the first pitch P1 is shorter than the second pitch P2 (i.e., P1<P2).

As shown in FIG. 1, in some embodiments, in the second direction D2, the third pitch P3 is between the first light-emitting unit C1 in the first region R21 of the light-emitting region PG2 and the first light-emitting unit C1 in the third region R23 of the light-emitting region PG2, the fourth pitch P4 is between the first light-emitting unit C1 in the third region R23 of the light-emitting region PG2 and the first light-emitting unit C1 in the first region R41 of the light-emitting region PG4 (i.e., the adjacent light-emitting region), and the third pitch P3 is shorter than the fourth pitch P4 (i.e., P3<P4).

As shown in FIG. 1, in some embodiments, in the first direction D1, the first pitch P1 is between the first light-emitting unit C1 in the third region R23 of the light-emitting region PG2 and the first light-emitting unit C1 in the fourth region R24 of the light-emitting region PG2, the second pitch P2 is between the first light-emitting unit C1 in the third region R23 of the light-emitting region PG2 and the first light-emitting unit C1 in the fourth region R14 of the light-emitting region PG1 (i.e., the adjacent light-emitting region), and the first pitch P1 is shorter than the second pitch P2 (i.e., P1<P2).

Moreover, as shown in FIG. 1, in some embodiments, in the second direction D2, the third pitch P3 is between the first light-emitting unit C1 in the second region R22 of the light-emitting region PG2 and the first light-emitting unit C1 in the fourth region R24 of the light-emitting region PG2, the fourth pitch P4 is between the first light-emitting unit C1 in the fourth region R24 of the light-emitting region PG2 and the first light-emitting unit C1 in the second region R42 of the light-emitting region PG4 (i.e., the adjacent light-emitting region), and the third pitch P3 is shorter than the fourth pitch P4 (i.e., P3<P4).

Referring to FIG. 1, the light-emitting region PG3 has first to fourth regions R31-R34. In some embodiments, the relative positions of the first to fourth regions R31-R34 are the same as or similar to the relative positions of the first to fourth regions R11-R14. In other words, the second region R32 is adjacent to the first region R31 in the first direction D1, the third region R33 is adjacent to the first region R31 in the second direction D2, and the fourth region R34 is adjacent to the third region R33 in the first direction D1 and adjacent to the second region R32 in the second direction D2.

As shown in FIG. 1, in some embodiments, in the first direction D1, the first pitch P1 is between the first light-emitting unit C1 in the first region R31 of the light-emitting region PG3 and the first light-emitting unit C1 in the second region R32 of the light-emitting region PG3, the second pitch P2 is between the first light-emitting unit C1 in the second region R32 of the light-emitting region PG3 and the first light-emitting unit C1 in the first region R41 of the light-emitting region PG4 (i.e., the adjacent light-emitting region), and the first pitch P1 is shorter than the second pitch P2 (i.e., P1 P2).

As shown in FIG. 1, in some embodiments, in the second direction D2, the third pitch P3 is between the first light-emitting unit C1 in the first region R31 of the light-emitting region PG3 and the first light-emitting unit C1 in the third region R33 of the light-emitting region PG3, the fourth pitch P4 is between the first light-emitting unit Cl in the first region R31 of the light-emitting region PG3 and the first light-emitting unit C1 in the third region R13 of the light-emitting region PG1 (i.e., the adjacent light-emitting region), and the third pitch P3 is shorter than the fourth pitch P4 (i.e., P3<P4).

As shown in FIG. 1, in some embodiments, in the first direction D1, the first pitch P1 is between the first light-emitting unit C1 in the third region R33 of the light-emitting region PG3 and the first light-emitting unit C1 in the fourth region R34 of the light-emitting region PG3, the second pitch P2 is between the first light-emitting unit C1 in the fourth region R34 of the light-emitting region PG3 and the first light-emitting unit C1 in the third region R43 of the light-emitting region PG4 (i.e., the adjacent light-emitting region), and the first pitch P1 is shorter than the second pitch P2 (i.e., P1<P2).

Moreover, as shown in FIG. 1, in some embodiments, in the second direction D2, the third pitch P3 is between the first light-emitting unit C1 in the second region R32 of the light-emitting region PG3 and the first light-emitting unit C1 in the fourth region R34 of the light-emitting region PG3, the fourth pitch P4 is between the first light-emitting unit C1 in the second region R32 of the light-emitting region PG3 and the first light-emitting unit C1 in the fourth region R14 of the light-emitting region PG1 (i.e., the adjacent light-emitting region), and the third pitch P3 is shorter than the fourth pitch P4 (i.e., P3<P4).

Referring to FIG. 1, the light-emitting region PG4 has first to fourth regions R41-R44. In some embodiments, the relative positions of the first to fourth regions R41-R44 are the same as or similar to the relative positions of the first to fourth regions R11-R14. In other words, the second region R42 is adjacent to the first region R41 in the first direction D1, the third region R43 is adjacent to the first region R41 in the second direction D2, and the fourth region R44 is adjacent to the third region R43 in the first direction D1 and adjacent to the second region R42 in the second direction D2.

As shown in FIG. 1, in some embodiments, in the first direction D1, the first pitch P1 is between the first light-emitting unit C1 in the first region R41 of the light-emitting region PG4 and the first light-emitting unit C1 in the second region R42 of the light-emitting region PG4, the second pitch P2 is between the first light-emitting unit C1 in the first region R41 of the light-emitting region PG4 and the first light-emitting unit C1 in the second region R32 of the light-emitting region PG3 (i.e., the adjacent light-emitting region), and the first pitch P1 is shorter than the second pitch P2 (i.e., P1<P2).

As shown in FIG. 1, in some embodiments, in the second direction D2, the third pitch P3 is between the first light-emitting unit C1 in the first region R41 of the light-emitting region PG4 and the first light-emitting unit C1 in the third region R43 of the light-emitting region PG4, the fourth pitch P4 is between the first light-emitting unit C1 in the first region R41 of the light-emitting region PG4 and the first light-emitting unit C1 in the third region R23 of the light-emitting region PG2 (i.e., the adjacent light-emitting region), and the third pitch P3 is shorter than the fourth pitch P4 (i.e., P3<P4).

As shown in FIG. 1, in some embodiments, in the first direction D1, the first pitch P1 is between the first light-emitting unit C1 in the third region R43 of the light-emitting region PG4 and the first light-emitting unit C1 in the fourth region R44 of the light-emitting region PG4, the second pitch P2 is between the first light-emitting unit C1 in the third region R43 of the light-emitting region PG4 and the first light-emitting unit C1 in the fourth region R34 of the light-emitting region PG3 (i.e., the adjacent light-emitting region), and the first pitch P1 is shorter than the second pitch P2 (i.e., P1<P2).

Moreover, as shown in FIG. 1, in some embodiments, in the second direction D2, the third pitch P3 is between the first light-emitting unit C1 in the second region R42 of the light-emitting region PG4 and the first light-emitting unit C1 in the fourth region R44 of the light-emitting region PG4, the fourth pitch P4 is between the first light-emitting unit C1 in the second region R42 of the light-emitting region PG4 and the first light-emitting unit C1 in the fourth region R24 of the light-emitting region PG2 (i.e., the adjacent light-emitting region), and the third pitch P3 is shorter than the fourth pitch P4 (i.e., P3<P4).

It should be noted that the aforementioned first pitch P1, second pitch P2, third pitch P3, and fourth pitch P4 are used to describe the relationship between the first light-emitting units C1 in different regions, but the present disclosure is not limited thereto. The first pitch P1, the second pitch P2, the third pitch P3, and the fourth pitch P4 may also be used to describe the relationship between the corresponding second light-emitting units C2 or the relationship between the corresponding third light-emitting units C3 in different regions, which will not be repeated here.

In the light-emitting diode display panel 100, the pitch (e.g., the first pitch P1 or the third pitch P3) between a light-emitting unit that emits light of a specific color (e.g., the first light-emitting unit C1) and an adjacent light-emitting unit that emits light of the same color in the same light-emitting region (e.g., the light-emitting region PG1) is shorter than the pitch (e.g., the second pitch P2 or the fourth pitch P4) between it and an adjacent light-emitting unit that emits light of the same color in an adjacent light-emitting region (e.g., the light-emitting region PG2 or the light-emitting region PG3).

In some embodiments, when the first pitch P1 is equal to the third pitch P3, and the first pitch P1 and the third pitch P3 are greater than about 0.6 mm and less than about 1.0 mm (e.g., 0.7 mm, 0.8 mm, or 0.9 mm). The 4-in-1 light-emitting diode package shown in FIG. 2 will be a small-pitch 4-in-1 light-emitting diode package, and the distance between the four pixels C is greater than about 0.6 mm and less than about 1.0 mm. Multiple 4-in-1 light-emitting diode packages are transferred to the driving substrate 10 through mass transfer to form the light-emitting diode display panel 100. As shown in FIG. 1, the distances between the 4-in-1light-emitting diode packages in the light-emitting diode display panel 100 are the second pitch P2 and the second pitch P4.

Using mass transfer technology to produce such a small-pitch 4-in-1 light-emitting diode package has production efficiency per unit time much higher than that of using a traditional die-bonder to produce a 4-in-1light-emitting diode package. Moreover, the production of such a small-pitch 4-in-1light-emitting diode package may effectively improve the area utilization of the package substrate, and more 4-in-1light-emitting diode packages may be arranged on a package substrate with a fixed area size.

For example, in the production of traditional 4-in-1light-emitting diode packages, the distance between adjacent light-emitting units that emit light of the same color is fixed (i.e., the first pitch P1 is equal to the second pitch P2 (P1=P2), and the third pitch P3 is equal to the fourth pitch P4 (P3=P4)), for example, about 1.2 mm. Compared with the production of multiple traditional 4-in-1light-emitting diode packages on the package substrate, by changing it to produce the 4-in-1light-emitting diode packages according to the embodiments of the present disclosure (i.e., the first pitch P1 is shorter than the second pitch P2 (P1<P2) and/or the third pitch P3 is shorter than the fourth pitch P4 (P3 <P4), and the first pitch P1 and the third pitch P3 are greater than about 0.6 mm and less than about 1.0 mm), the area utilization (production capacity) of the package substrate per unit area may be increased by up to double.

Furthermore, when the first pitch P1 and the third pitch P3 are greater than about 0.6 mm and less than about 1.0 mm, the light-emitting units (e.g., the first light-emitting unit C1, the second light-emitting unit C2, and the third light-emitting unit C3) in the 4-in-1light-emitting diode package are arranged closer. Therefore, a smaller size light-emitting unit may be selected to meet the brightness requirements of the central light-emitting region of the package, resulting in a reduction in the cost of the light-emitting unit.

Figure 3:
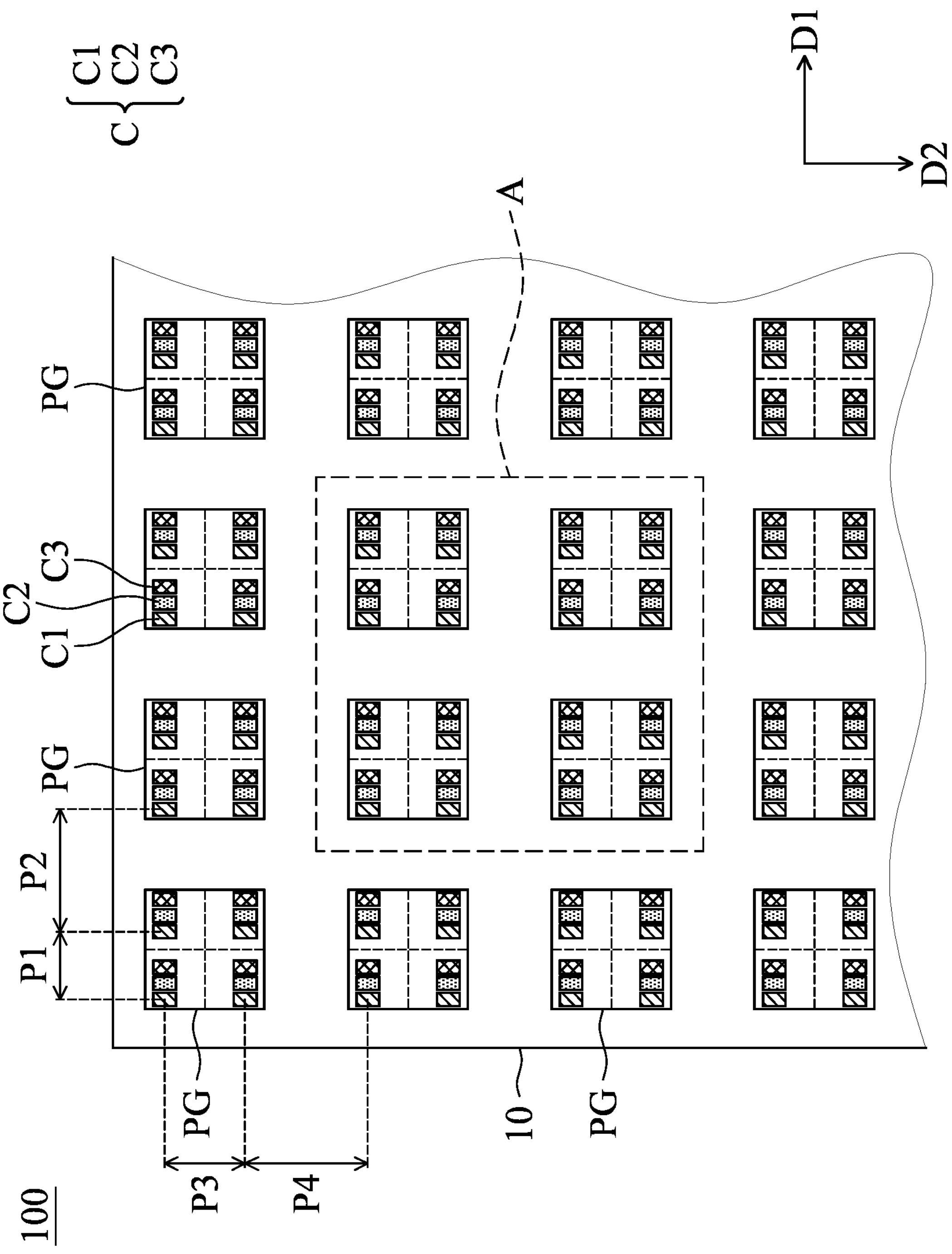
FIG. 3 is a partial top view illustrating the light-emitting diode display panel according to an embodiment of the present disclosure.

FIG. 3 is a partial top view illustrating the light-emitting diode display panel 100 according to an embodiment of the present disclosure. For example, FIG. 1 may be an enlarged view of block A in FIG. 3, but the present disclosure is not limited thereto. Referring to FIG. 3, in some embodiments, multiple light-emitting regions PG are disposed on the driving substrate 10 and form an array. Each light-emitting region PG has (or is divided into) multiple (e.g., four) regions, and the pixel C (which includes the first light-emitting unit C1, the second light-emitting unit C2, and the third light-emitting unit C3) is arranged in each region.

Figure 4:
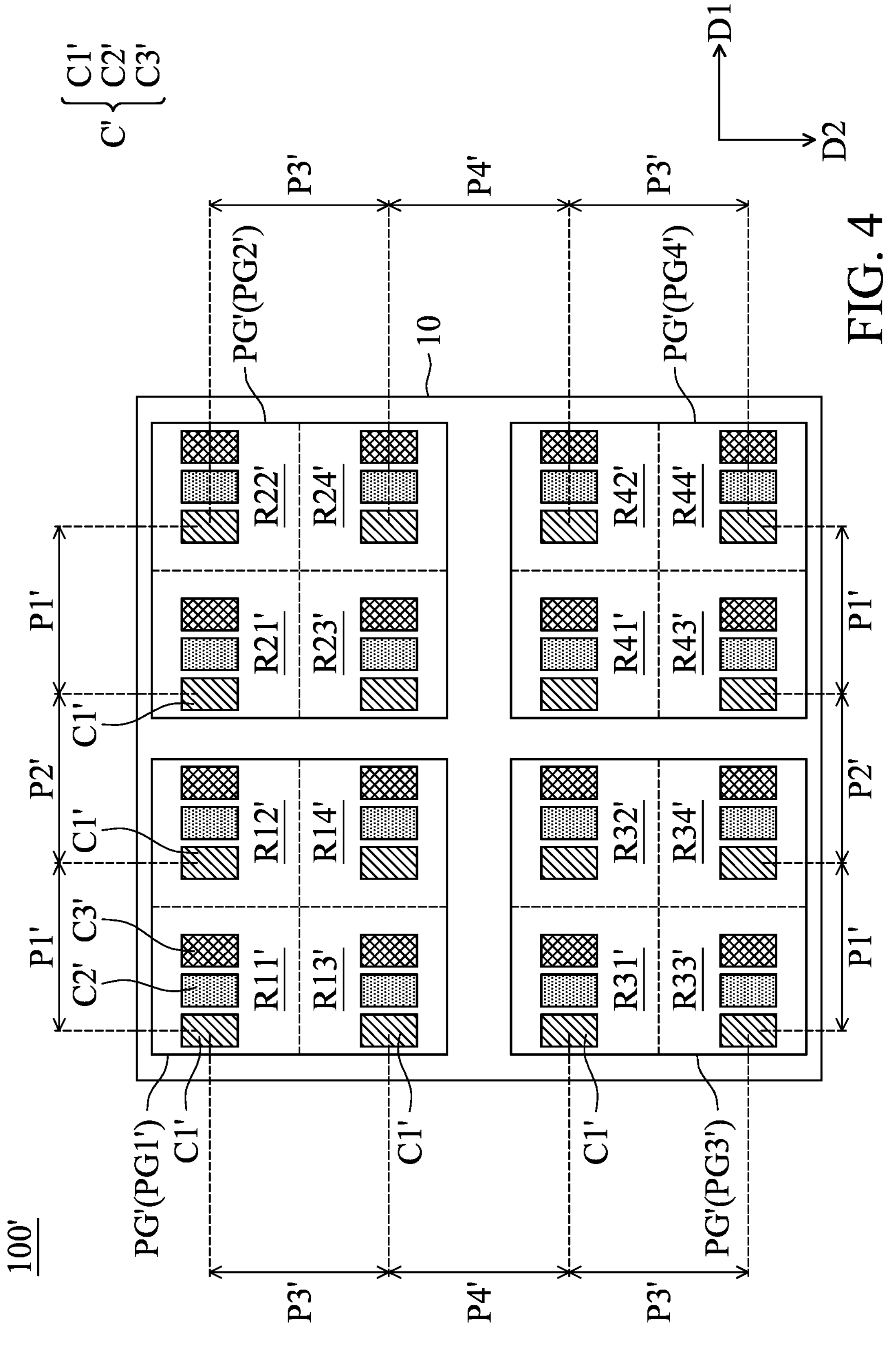
FIG. 4 is a partial top view illustrating the light-emitting diode display panel according to a comparative example.

FIG. 4 is a partial top view illustrating the light-emitting diode display panel 100' according to a comparative example. For example, the light-emitting diode display panel 100' includes multiple (four shown in FIG. 4) conventional 4-in-1light-emitting diode packages, and the distance between adjacent light-emitting units that emit light of the same color is fixed. In more detail, the light-emitting diode display panel 100' includes multiple light-emitting regions PG', wherein each light-emitting region PG' has multiple (e.g., four) regions, and the pixel C' is disposed in each region.

In particular, as shown in FIG. 1, the light-emitting diode display panel 100' includes a light-emitting region PG1', a light-emitting region PG2', a light-emitting region PG3', and a light-emitting region PG4'. The light-emitting region PG1', the light-emitting region PG2', the light-emitting region PG3', and the light-emitting region PG4' may have the same or similar structures. Moreover, the pixel C' is disposed in the first to fourth regions R11'-R14' of the light-emitting region PG1', in the first to fourth regions R21' -R24' of the light-emitting region PG2', in the first to fourth regions R31'-R34' of the light-emitting region PG3', and in the first to fourth regions R41'-R44' of the light-emitting region PG4'. Each pixel C' includes a first light-emitting unit C1', a second light-emitting unit C2', and a third light-emitting unit C3'.

In the light-emitting diode display panel 100', the distance between adjacent light-emitting units that emit light of the same color is fixed. For example, the first pitch P1' is between the first light-emitting unit C1' in the first region R11' of the light-emitting region PG1' and the first light-emitting unit C1' in the second region R12' of the light-emitting region PG1', the second pitch P2' is between the first light-emitting unit C1' in the second region R12' of the light-emitting region PG1' and the first light-emitting unit C1' in the first region R21' of the light-emitting region PG2' (i.e., the adjacent light-emitting region), and the first pitch P1' is equal to the second pitch P2' (i.e., P1=P2).

Alternately, the third pitch P3' is between the first light-emitting unit C1' in the first region R11' of the light-emitting region PG1' and the first light-emitting unit C1' in the third region R13' of the light-emitting region PG1', the fourth pitch P4' is between the first light-emitting unit C1 in the third region R13' of the light-emitting region PG1' and the first light-emitting unit C1' in the first region R31' of the light-emitting region PG3' (i.e., the adjacent light-emitting region), and the third pitch P3' is equal to the fourth pitch P4' (i.e., P3=P4).

Figure 5:
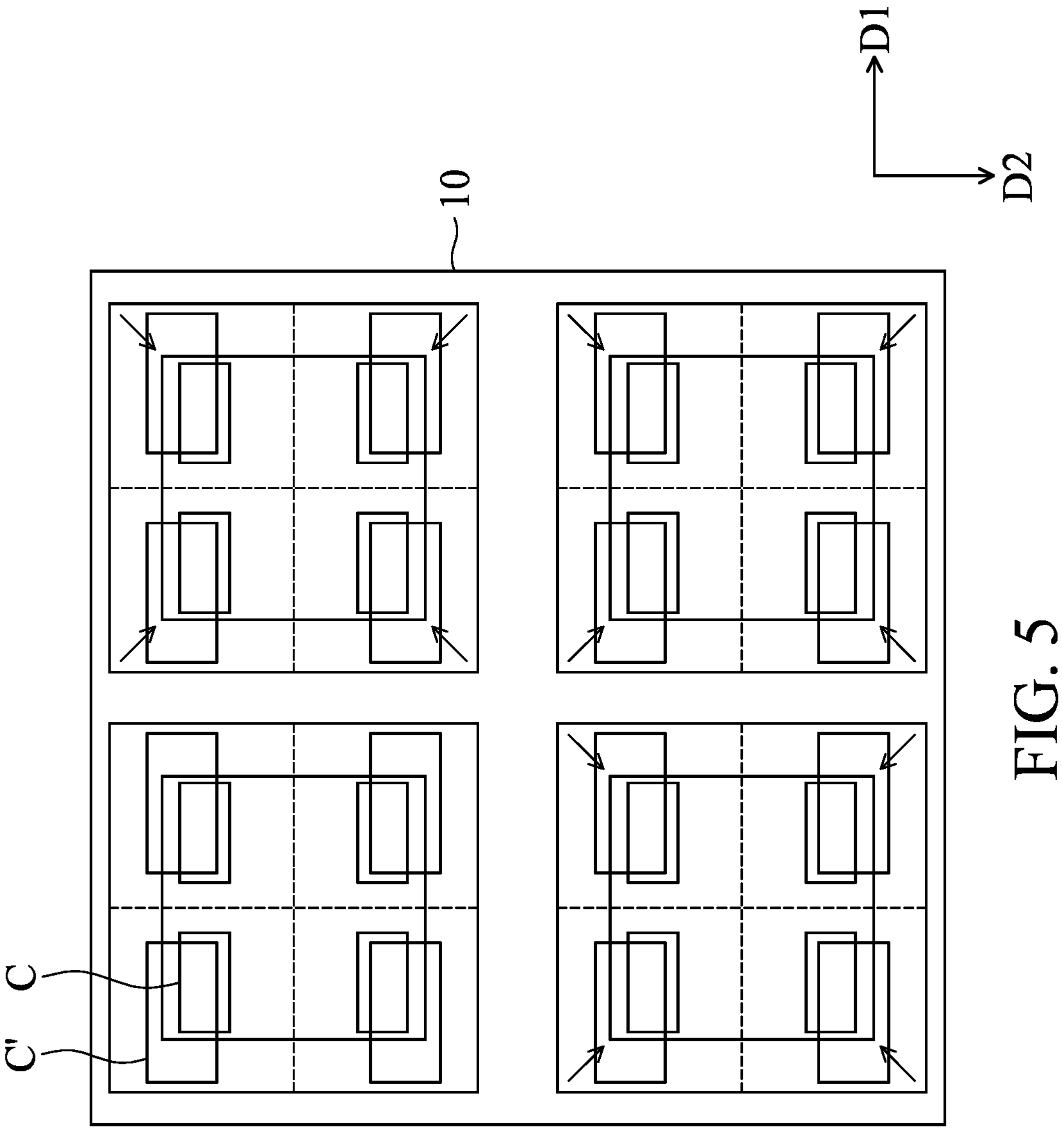
FIG. 5 illustrates a schematic diagram showing the overlapping the light-emitting diode display panel according to the embodiment of the present disclosure and the light-emitting diode display panel of the comparative example.

FIG. 5 illustrates a schematic diagram showing the overlapping the light-emitting diode display panel 100 according to the embodiment of the present disclosure and the light-emitting diode display panel 100' of the comparative example. It should be noted that, the detailed structure of the pixel C (e.g., the first light-emitting unit C1, the second light-emitting unit C2, and the third light-emitting unit C3) of the light-emitting diode display panel 100 and the detailed structure of the pixel C' (e.g., the first light-emitting unit C1', the second light-emitting unit C2', and the third light-emitting unit C3') of the light-emitting diode display panel 100' has been omitted for a clearer comparison.

The light-emitting diode display panel 100 according to the embodiment of the present disclosure includes light-emitting units with non-fixed pitches (i.e., non-equidistant arrangements), and the light-emitting diode display panel 100' of the comparative example includes light-emitting units having a fixed pitch (i.e., equidistant arrangement). As shown in FIG. 5, the 4-in-1light-emitting diode package in the light-emitting diode display panel 100 according to the embodiment of the present disclosure may be formed by pulling the four pixels C' in the 4-in-1light-emitting diode package of the comparative example by 0.1 mm, 0.2 mm, or 0.3 mm closer to the center (and adjusting the size of its internal light-emitting units).

The numerical model may be used to simulate the local color mixing caused when the image color blocks are brought closer in space, and to observe the visual difference between the images presented by the light-emitting diode display panel 100 according to the embodiment of the present disclosure and the light-emitting diode display panel 100' of the comparative example. Through the simulated structure, under the condition of a distance of one meter and the observer's viewing angle of 2 degrees, the visual difference between the images presented by the light-emitting diode display panel 100 according to the embodiment of the present disclosure and the light-emitting diode display panel 100' of the comparative example is extremely small and difficult to detect. In other words, the image presented by the light-emitting diode display panel 100 according to the embodiment of the present disclosure may still maintain good quality.

Figure 6:
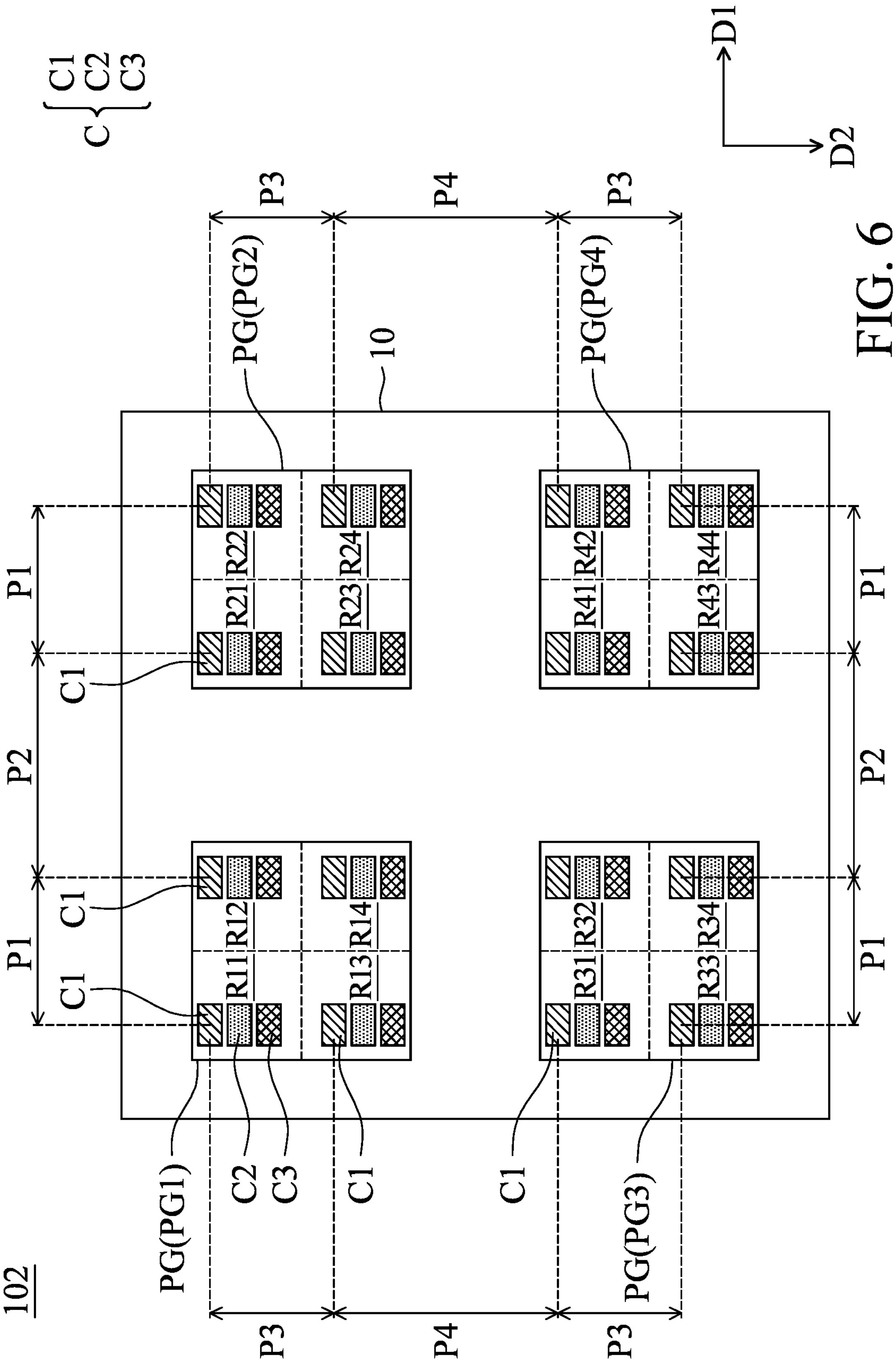
FIG. 6 is a partial top view illustrating the light-emitting diode display panel according to another embodiment of the present disclosure.
Figure 7:
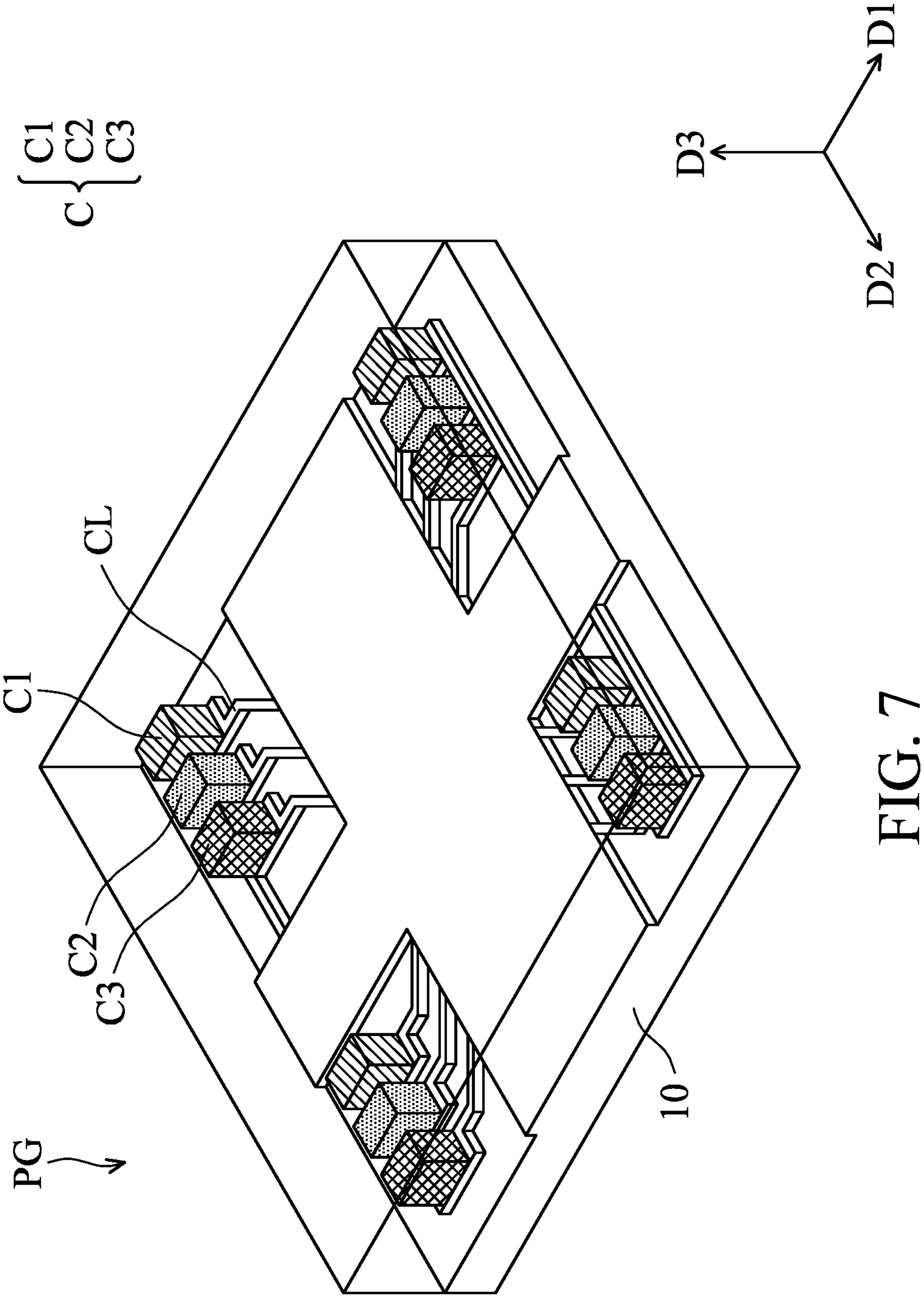
FIG. 7 is a three-dimensional view of the light-emitting region taking another light-emitting diode package with multiple pixels as an embodiment according to the present disclosure.

FIG. 6 is a partial top view illustrating the light-emitting diode display panel 102 according to another embodiment of the present disclosure. The light-emitting diode display panel 102 includes multiple light-emitting regions PG. FIG. 7 is a three-dimensional view of the light-emitting region PG taking another light-emitting diode package with multiple pixels as an embodiment according to the present disclosure. Similarly, some components of the light-emitting diode display panel 102 and/or the light-emitting region PG have been omitted in FIG. 6 and FIG. 7 for sake of brevity.

The light-emitting diode display panel 102 shown in FIG. 6 has a structure similar to that of the light-emitting diode display panel 100 shown in FIG. 1 (and FIG. 3). The main difference lies in the arrangement of the pixel units in the pixel C.

In particular, as shown in FIG. 6 and FIG. 7, in some embodiments, the second light-emitting unit C2 is between the first light-emitting unit C1 and the third light-emitting unit C3, and the first light-emitting unit C1, the second light-emitting unit C2, and the third light-emitting unit C3 are arranged in the second direction D2. As shown in FIG. 7, the first light-emitting unit C1, the second light-emitting unit C2, and the third light-emitting unit C3 may be electrically connected to the driving substrate 10 through the conductive line CL.

Similarly, referring to FIG. 6, in some embodiments, in the first direction D1, the first pitch P1 is between the first light-emitting unit C1 in the first region R11 of the light-emitting region PG1 and the first light-emitting unit C1 in the second region R12 of the light-emitting region PG1, the second pitch P2 is between the first light-emitting unit C1 in the second region R12 of the light-emitting region PG1 and the first light-emitting unit C1 in the first region R21 of the light-emitting region PG2 (i.e., the adjacent light-emitting region), and the first pitch P1 is shorter than the second pitch P2 (i.e., P1<P2).

Moreover, as shown in FIG. 6, in some embodiments, in the second direction D2, the third pitch P3 is between the first light-emitting unit C1 in the first region R11 of the light-emitting region PG1 and the first light-emitting unit C1 in the third region R13 of the light-emitting region PG1, the fourth pitch P4 is between the first light-emitting unit C1 in the third region R11 of the light-emitting region PG1 and the first light-emitting unit C1 in the first region R31 of the light-emitting region PG3 (i.e., the adjacent light-emitting region), and the third pitch P3 is shorter than the fourth pitch P4 (i.e., P3<P4).

In summary, in the light-emitting diode display panel according to the embodiments of the present disclosure, the pitch between a light-emitting unit that emits light of a specific color and an adjacent light-emitting unit that emits light of the same color in the same light-emitting region (e.g., the light-emitting diode package) is shorter than the pitch between it and an adjacent light-emitting unit that emits light of the same color in an adjacent light-emitting region. Mass transfer technology may be used to produce such a small-pitch N-in-1 (e.g., 4-in-1) light-emitting diode package, of which production efficiency per unit time is much higher than that of an N-in-1 light-emitting diode package by using a traditional die-bonder. Moreover, the production of such a small-pitch N-in-1 light-emitting diode package may effectively improve the area utilization of the package substrate, and more N-in-1 light-emitting diode packages may be arranged on a package substrate with a fixed area size.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description provided herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A light-emitting diode display panel, comprising:

a driving substrate;

a first light-emitting region disposed on the driving substrate and having a first region and a second region, wherein the second region is adjacent to the first region in a first direction;

a second light-emitting region disposed on the driving substrate and adjacent to the first light-emitting region in the first direction, wherein the second light-emitting region has a first corresponding region, and the second region is between the first region and the first corresponding region; and a plurality of pixels disposed in the first region, the second region, and the first corresponding region, wherein each of the pixels comprises a first light-emitting unit, a second light-emitting unit, and a third light-emitting unit;

wherein a first pitch is between the first light-emitting unit in the first region and the first light-emitting unit in the second region, a second pitch is between the first light-emitting unit in the second region and the first light-emitting unit in the first corresponding region, and the first pitch is shorter than the second pitch.

2. The light-emitting diode display panel as claimed in claim 1, wherein the second light-emitting unit is between the first light-emitting unit and the third light-emitting unit, and the first light-emitting unit, the second light-emitting unit, and the third light-emitting unit are arranged in the first direction.

3. The light-emitting diode display panel as claimed in claim 1, wherein the first light-emitting region has a third region, and the third region is adjacent to the first region in a second direction that is perpendicular to the first direction.

4. The light-emitting diode display panel as claimed in claim 3, further comprising:

a third light-emitting region disposed on the driving substrate and adjacent to the first light-emitting region in the second direction, wherein the third light-emitting region has a second corresponding region, and the second region is between the first region and the second corresponding region.

5. The light-emitting diode display panel as claimed in claim 4, wherein the pixels are disposed in the third region and the second corresponding region, a third pitch is between the first light-emitting unit in the first region and the first light-emitting unit in the third region, a fourth pitch is between the first light-emitting unit in the third region and the first light-emitting unit in the second corresponding region, and the third pitch is shorter than the fourth pitch.

6. The light-emitting diode display panel as claimed in claim 5, wherein the third pitch is equal to the first pitch, and the fourth pitch is equal to the second pitch.

7. The light-emitting diode display panel as claimed in claim 1, wherein a ratio of the first pitch to the second pitch is between 0.3 and 0.9.

8. The light-emitting diode display panel as claimed in claim 1, wherein the first light-emitting unit, the second light-emitting unit, and the third light-emitting unit emit different color lights, and the different color lights comprise red light, green light, and blue light.

9. The light-emitting diode display panel as claimed in claim 1, wherein the first light-emitting unit, the second light-emitting unit, and the third light-emitting unit comprise micro light-emitting diode chips, and the first pitch is greater than 0.6 mm and less than 1.0 mm.

10. A light-emitting diode display panel, comprising:

a driving substrate;

a plurality of light-emitting regions disposed on the driving substrate and forming an array, wherein each of the light-emitting regions has a first region and a second region adjacent to the first region in a first direction; and a plurality of pixels disposed in the first region and the second region, wherein each of the pixels comprises a first light-emitting unit, a second light-emitting unit, and a third light-emitting unit;

wherein in one of the light-emitting regions, a first pitch is between the first light-emitting unit in the first region and the first light-emitting unit in the second region, a second pitch is between the first light-emitting unit in the second region and the first light-emitting unit in another adjacent light-emitting region, and the first pitch is shorter than the second pitch.

11. The light-emitting diode display panel as claimed in claim 10, wherein the second light-emitting unit is between the first light-emitting unit and the third light-emitting unit, and the first light-emitting unit, the second light-emitting unit, and the third light-emitting unit are arranged in the first direction.

12. The light-emitting diode display panel as claimed in claim 10, wherein the light-emitting region and the other adjacent light-emitting region are arranged in the first direction.

13. The light-emitting diode display panel as claimed in claim 10, wherein the light-emitting region and the other adjacent light-emitting region are arranged in a second direction that is perpendicular to the first direction.

14. The light-emitting diode display panel as claimed in claim 10, wherein a ratio of the first pitch to the second pitch is between 0.3 and 0.9.

15. The light-emitting diode display panel as claimed in claim 10, wherein the first light-emitting unit, the second light-emitting unit, and the third light-emitting unit emit different color lights, and the different color lights comprise red light, green light, and blue light.

16. The light-emitting diode display panel as claimed in claim 10, wherein the first light-emitting unit, the second light-emitting unit, and the third light-emitting unit comprise micro light-emitting diode chips, and the first pitch is greater than 0.6 mm and less than 1.0 mm.

* * * * *